United States Patent
Choi et al.

(10) Patent No.: US 7,646,056 B2
(45) Date of Patent: Jan. 12, 2010

(54) GATE STRUCTURES OF A NON-VOLATILE MEMORY DEVICE AND METHODS OF MANUFACTURING THE SAME

(75) Inventors: Han-Mei Choi, Seoul (KR); Kyoung-Ryul Yoon, Gyeonggi-do (KR); Seung-Hwan Lee, Seoul (KR); Ki-Yeon Park, Gyeonggi-do (KR); Young-Sun Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 493 days.

(21) Appl. No.: 11/375,762

(22) Filed: Mar. 15, 2006

(65) Prior Publication Data

US 2006/0220106 A1    Oct. 5, 2006

(30) Foreign Application Priority Data

Mar. 31, 2005    (KR)    .................... 10-2005-0027080

(51) Int. Cl.
    *H01L 29/792*    (2006.01)
(52) U.S. Cl. ............... 257/325; 257/310; 257/E29.309; 257/E21.423
(58) Field of Classification Search ................. 257/325, 257/310, E29.309, E21.423
    See application file for complete search history.

(56) References Cited

U.S. PATENT DOCUMENTS

| | | | |
|---|---|---|---|
| 6,639,271 B1 * | 10/2003 | Zheng et al. ................. | 257/324 |
| 6,645,882 B1 * | 11/2003 | Halliyal et al. ............... | 438/785 |
| 6,649,972 B2 | 11/2003 | Eitan | |
| 6,660,660 B2 | 12/2003 | Haukka et al. | |
| 6,677,640 B1 * | 1/2004 | Sandhu et al. ............... | 257/324 |
| 6,803,272 B1 * | 10/2004 | Halliyal et al. ............... | 438/240 |
| 6,849,925 B1 * | 2/2005 | Halliyal et al. ............... | 257/635 |
| 6,868,014 B1 | 3/2005 | Melik-Martirosian et al. | |
| 2002/0100931 A1 * | 8/2002 | Nuttall et al. ................ | 257/324 |
| 2003/0047755 A1 * | 3/2003 | Lee et al. ..................... | 257/200 |

(Continued)

FOREIGN PATENT DOCUMENTS

JP    2004-158810    6/2004

(Continued)

OTHER PUBLICATIONS

Notice to Submit Response in Korean Application No. 10-2005-0027080; Date of mailing May 25, 2006.

(Continued)

*Primary Examiner*—David Vu
*Assistant Examiner*—Earl N Taylor
(74) *Attorney, Agent, or Firm*—Myers Bigel Sibley & Sajovec, P.A.

(57) ABSTRACT

In a gate structure of a non-volatile memory device is formed, a tunnel insulating layer and a charge trapping layer are formed on a substrate. A composite dielectric layer is formed on the charge trapping layer and has a laminate structure in which first material layers including aluminum oxide and second material layers including hafnium oxide or zirconium oxide are alternately stacked. A conductive layer is formed on the composite dielectric layer and then a gate structure is formed by patterning the conductive layer, the composite dielectric layer, the charge trapping layer, and the tunnel insulating layer.

10 Claims, 9 Drawing Sheets

U.S. PATENT DOCUMENTS

| | | | |
|---|---|---|---|
| 2003/0048666 A1* | 3/2003 | Eldridge et al. | 365/185.28 |
| 2003/0183870 A1* | 10/2003 | Sugiyama | 257/314 |
| 2004/0135217 A1* | 7/2004 | Yamamoto | 257/410 |
| 2004/0232470 A1* | 11/2004 | Zheng et al. | 257/311 |
| 2004/0251489 A1 | 12/2004 | Jeon et al. | |
| 2005/0045943 A1* | 3/2005 | Lung et al. | 257/325 |
| 2006/0131633 A1* | 6/2006 | Bhattacharyya | 257/314 |
| 2006/0261401 A1* | 11/2006 | Bhattacharyya | 257/316 |

FOREIGN PATENT DOCUMENTS

| | | |
|---|---|---|
| KR | 1020040093606 A | 11/2004 |
| KR | 1020040106074 A | 12/2004 |

OTHER PUBLICATIONS

English translation of Notice to Submit Response in Korean Application No. 10-2005-0027080; Date of mailing May 25, 2006.

* cited by examiner

GATE STRUCTURES OF A NON-VOLATILE MEMORY DEVICE AND METHODS OF MANUFACTURING THE SAME

CROSS REFERENCE TO RELATED APPLICATION

This application claims the benefit under 35 USC § 119 of Korean Patent Application No. 2005-27080 filed on Mar. 31, 2005 the disclosure of which is hereby incorporated herein by reference in its entirety as if set forth fully herein.

BACKGROUND OF THE INVENTION

1. Field of the Invention

The present invention relates to non-volatile memory devices and methods of manufacturing the same. More particularly, the present invention relates to gate structures, such as silicon oxide nitride oxide semiconductor (SONOS) structures or metal oxide nitride oxide semiconductor (MONOS) structures, of non-volatile memory devices and methods of manufacturing the same.

2. Description of the Related Art

A semiconductor device, in general, may be classified as a volatile semiconductor memory device or a non-volatile semiconductor memory device. Volatile semiconductor memory devices, such as dynamic random access memory (DRAM) devices and/or static random access memory (SRAM) devices, have a relatively high response speed. However, the volatile semiconductor memory devices may lose data stored therein when applied power is shut off. Although non-volatile semiconductor memory devices, such as electrically erasable programmable read only memory (EEPROM) devices and/or flash memory devices, have a relatively slow response speed, non-volatile semiconductor memory devices can maintain data stored therein when the applied power is shut off. In EEPROM devices, data may be electrically stored (i.e., programmed) or erased through a Fowler-Nordheim (F-N) tunneling mechanism and/or a channel hot electron injection mechanism. Flash memory devices may be classified into non-volatile memory devices of the type having a floating gate electrode and non-volatile memory devices of SONOS type or MONOS type.

For example, non-volatile memory devices including a tunnel oxide layer, a charge trapping layer, and a gate dielectric layer (or a blocking layer) are disclosed in U.S. Patent Application Publication No. 2004/0251489, Japanese Patent Application Publication No. 2004-158810 and Korean Patent Application Publication Nos. 2004-106074 and 2004-93606.

Recently, a high-k material layer having a relatively high dielectric constant (or permittivity) has been used as a gate dielectric layer. For example, a high-k material, such as aluminum oxide, hafnium oxide, zirconium oxide, and the like, has been used in the gate dielectric layer for improving the capacitance of a cell transistor.

According to U.S. Patent Application Publication No. 2004/0251489, a SONOS memory device includes a tunnel oxide layer, a memory node layer, a blocking layer, and an electrode layer. The blocking layer includes an aluminum oxide layer serving as a first blocking layer and a hafnium oxide layer or a zirconium oxide layer serving as a second blocking layer. When, the high-k material is used in the gate dielectric layer of the non-volatile memory device is of the SONOS type, a leakage current problem may occur due to crystallization of the gate dielectric layer.

In more detail, a gate structure is formed by patterning the tunnel oxide layer, the memory node layer, the blocking layer, and the electrode layer. Damage caused by the patterning process may be cured by performing a heat treatment process. The blocking layer of the gate structure is crystallized during the heat treatment. The crystallization of the blocking layer may cause current to leak through the blocking layer, which may deteriorate operating characteristics of the non-volatile memory device. The problem may be exacerbated when the high-k material is individually used in a single layered gate dielectric layer as the surface morphology of the gate dielectric layer may deteriorate and leakage current through the gate dielectric layer may increase.

SUMMARY OF THE INVENTION

According to some embodiments of the present invention, a gate structure of a non-volatile memory device may include a tunnel insulating layer pattern formed on a substrate, a charge trapping layer pattern formed on the tunnel insulating layer pattern, a composite dielectric layer pattern formed on the charge trapping layer pattern, the composite dielectric layer pattern having a laminate structure in which a plurality of first material layer patterns including aluminum oxide and a plurality of second material layer patterns including a high-k material having a dielectric constant higher than that of aluminum oxide are alternately stacked, and a gate electrode formed on the composite dielectric layer pattern.

In other embodiments of the present invention, each of the second material layer patterns may include hafnium oxide or zirconium oxide having a dielectric constant higher than that of the aluminum oxide. Further, an uppermost layer and a lowermost layer of the composite dielectric layer pattern may each comprise an aluminum oxide layer. Particularly, the first material layer patterns may have thicknesses that decrease from the uppermost and lowermost layers of the composite dielectric layer pattern toward a center of the composite dielectric layer pattern, while the second material layer patterns may have thicknesses that increase from the uppermost and lowermost layers of the composite dielectric layer pattern toward the center of the composite dielectric layer pattern.

In still other embodiments of the present invention, the composite dielectric layer pattern may have a thickness of about 50 to about 500 Å, and each of the first and second material layer patterns may have a thickness of about 1 to about 30 Å.

In still other embodiments of the present invention, the gate electrode may be an impurity doped polysilicon layer pattern, a metal layer pattern, or a combination thereof. A barrier layer may be interposed between the composite dielectric layer pattern and the gate electrode so as to reduce or prevent diffusion of metal or impurities.

In further embodiments of the present invention, a tunnel insulating layer is formed on a substrate. A charge trapping layer is then formed on the tunnel insulating layer. A composite dielectric layer is formed on the charge trapping layer, wherein the composite dielectric layer has a laminate structure in which a plurality of first material layers including aluminum oxide and a plurality of second material layers including a high-k material having a dielectric constant higher than that of aluminum oxide are alternately stacked. Then, a conductive layer is formed on the composite dielectric layer. A gate structure, which includes a tunnel insulating layer pattern, a charge trapping layer pattern, a composite dielectric layer pattern and a gate electrode, is formed by patterning the conductive layer, the composite dielectric layer, the charge trapping layer and the tunnel insulating layer.

In further embodiments of the present invention, the first material layers may be formed by a first atomic layer deposition (ALD) process using an aluminum precursor and a first oxidizing agent, and the second material layers may be formed by a second ALD process using a hafnium precursor or a zirconium precursor and a second oxidizing agent substantially identical to the first oxidizing agent.

In still further embodiments of the present invention, the aluminum precursor may comprise $Al(CH_3)_3$ (trimethyl aluminum; TMA), $Al(C_2H_5)_3$ (triethyl aluminum; TEA), and the like. The hafnium precursor may comprise $Hf[N(CH_3)_2]_4$ (tetrakis dimethyl amino hafnium; TDMAH), $Hf[N(C_2H_5)CH_3]_4$ (tetrakis ethyl methyl amino hafnium; TEMAH), $Hf[N(C_2H_5)_2]_4$ (tetrakis diethyl amino hafnium; TDEAH), $Hf[OC(CH_3)_2CH_2OCH_3]_4$, $Hf[OC(CH_3)_3]_4$, and the like. The zirconium precursor may comprise $Zr[N(CH_3)C_2H_5]_4$ (tetrakis ethyl methyl amino zirconium; TEMAZ), $Zr(O\text{-}tBu)_4$ (zirconium t-butoxide), and the like. These precursors may be used alone or in a mixture thereof.

In still further embodiments of the present invention, the first atomic layer deposition process for forming each of the first material layers and the second atomic layer deposition process for forming each of the second material layers may be repeatedly performed from one to about twenty times. Particularly, the number of times the first atomic layer deposition process is repeated may decrease as the first material layers are formed from the charge trapping layer toward a center of the composite dielectric layer and increase as the first material layers are formed from the center of the composite dielectric layer toward the conductive layer. The number of times the second atomic layer deposition process is repeated may increase as the second material layers are formed from the charge trapping layer toward the center of the composite dielectric layer and decrease as the second material layers are formed from the center of the composite dielectric layer toward the conductive layer.

In further embodiments of the present invention, each of the first and second material layers may have a thickness in a range of about 1 to about 30 Å, thereby restraining crystallization of the composite dielectric layer serving as a gate dielectric layer. Here, the aluminum oxide layer has a relatively high energy band gap and, as a result, may decrease leakage current through the composite dielectric layer. Further, the hafnium oxide layer or zirconium oxide layer having a relatively high dielectric constant may increase capacitance of the gate structure.

Moreover, the leakage current restraining effect may be further improved by forming the first material layers that are adjacent to the gate electrode and the charge trapping layer to thicknesses greater than those of the first material layers at the center of the composite dielectric layer. The capacitance may be further increased by forming the second material layers at the center of the composite dielectric layer to thicknesses greater than those of the second material layers adjacent to the gate electrode and the charge trapping layer.

BRIEF DESCRIPTION OF THE DRAWINGS

Other features of the present invention will be more readily understood from the following detailed description of specific embodiments thereof when read in conjunction with the accompanying drawings, in which.

DESCRIPTION OF THE EMBODIMENTS

Figure 1:
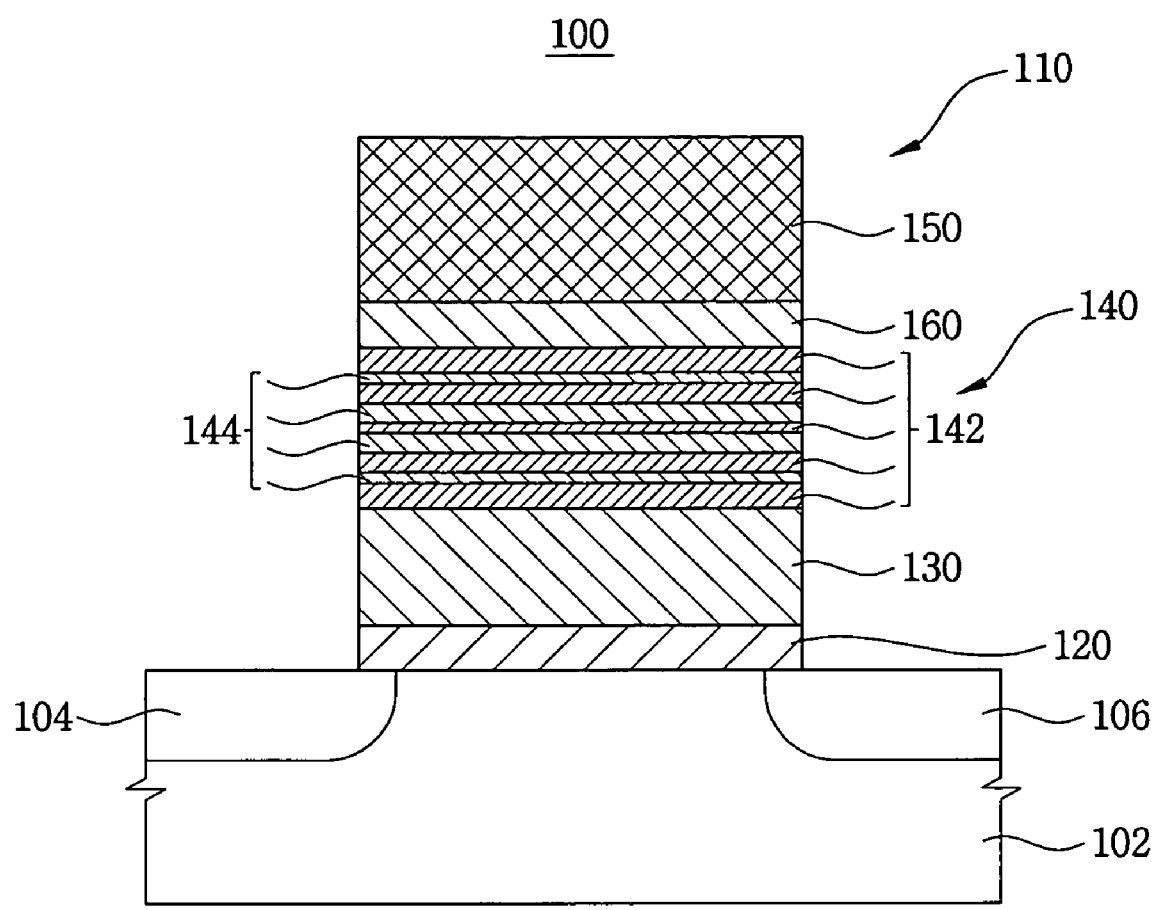
FIG. 1 is a cross-sectional view illustrating a gate electrode of a non-volatile memory device in accordance with some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, embodiments of the present invention will be explained in detail with reference to the accompanying drawings. Example embodiments of the present invention may provide a gate structure of a non-volatile memory device capable of increasing capacitance and restraining leakage current through a gate dielectric layer. Example embodiments of the present invention may also provide a method of manufacturing a gate structure of a non-volatile memory device capable of increasing capacitance and restraining leakage current through a gate dielectric layer.

FIG. 1 is a cross-sectional view illustrating a gate electrode of a non-volatile memory device in accordance with some embodiments of the present invention. Referring to FIG. 1, a gate electrode 110 of a non-volatile memory device 100 may be formed on a semiconductor substrate 102, such as a silicon wafer, and include a tunnel insulating layer pattern 120, a charge trapping layer pattern 130, a composite dielectric layer pattern 140, and a gate electrode 150, which are successively stacked.

Particularly, the tunnel insulating layer pattern 120 may include silicon oxide ($SiO_2$) and be formed to a thickness of about 10 to about 100 Å on the substrate 102. For example, the tunnel insulating layer pattern 120 may have a thickness of about 40 Å. The charge trapping layer pattern 130 may include silicon nitride ($Si_3N_4$) and be formed to a thickness of about 50 to about 150 Å on the tunnel insulating layer pattern 120. For example, the charge trapping layer pattern 130 may have a thickness of about 100 Å.

The composite dielectric layer pattern 140 may be formed to a thickness of about 50 to about 500 Å on the charge trapping layer pattern 130 and include aluminum oxide ($Al_2O_3$) and a high-k material having a dielectric constant (or permittivity) higher than that of aluminum oxide. Particularly, the composite dielectric layer pattern 140 may be formed to a thickness of about 70 to about 120 Å. For example, the composite dielectric layer pattern 140 may be formed to a thickness of about 100 Å. When the composite dielectric layer pattern 140 has a thickness less than about 50 Å, it may be difficult to sufficiently restrain leakage current therethrough. On the contrary, when the composite dielectric layer pattern 140 has a thickness greater than about 500 Å, capacitance of the composite dielectric layer pattern 140 may be reduced, and the operating voltage of the non-volatile memory device 100 may increase.

In detail, the composite dielectric layer pattern 140 may have a laminate structure in which a plurality of first material layer patterns 142, including aluminum oxide, and a plurality of second material layer patterns 144, including a high-k material having a dielectric constant higher than that of the aluminum oxide, are alternately stacked. The high-k material may include hafnium oxide ($HfO_2$), zirconium oxide ($ZrO_2$), and the like in accordance with various embodiments of the present invention. Each of the first and second material layer patterns 142 and 144 may have a thickness of about 1 to about 30 Å and be formed by an ALD process.

The first material layer patterns 142 may have a relatively high energy band gap with respect to the second material layer patterns 144 and, thus, the leakage current through the composite dielectric layer pattern 140 may be restrained. Because the second material layer patterns 144 have a relatively high dielectric constant, the capacitance of the composite dielectric layer pattern 140 may be increased. Further, each of the first and second material layer patterns 142 and 144 has a thickness equal to or less than about 30 Å, and thus the composite dielectric layer pattern 140 may be restrained from crystallizing during a subsequent heat treatment.

Each of the first and second material layer patterns 142 and 144 may have a predetermined thickness. Alternatively, the first material layer patterns 142 may have thicknesses that gradually increase from a center of the composite dielectric layer pattern 140 toward the charge trapping layer pattern 130 and the gate electrode 150 so as to improve the leakage current restraining effect. Further, the second material layer patterns 144 may have thicknesses that gradually increase from the charge trapping layer pattern 130 and the gate electrode 150 toward the center of the composite dielectric layer pattern 140 so as to improve capacitance of the composite dielectric layer pattern 140. A ratio of a total thickness of the first material layer patterns 142 to a total thickness of the second material layer patterns 144 may be from about 1:0.05 to 1:20 in accordance with some embodiments of the present invention. Particularly, a total thickness ratio of the first material layer patterns 142 to the second material layer patterns 144 may be from about 1:0.5 to about 1:5. Further, an uppermost layer and a lowermost layer of the composite dielectric layer pattern 140 may each comprise an aluminum oxide layer pattern so as to improve the leakage current restraining effect.

The gate electrode 150 may be formed to a thickness of about 1000 to about 3000 Å on the composite dielectric layer pattern 140 and include impurity doped polysilicon, metal, and the like in accordance with some embodiments of the present invention. Further, the gate electrode 150 may include a first conductive layer pattern (not shown) of impurity doped polysilicon and a second conductive layer pattern (not shown) of metal. For example, the gate electrode 150 may include polysilicon doped with n-type impurities or tungsten. Further, the gate electrode 150 may include a first conductive layer pattern formed of polysilicon doped with n-type impurities and a second conductive layer pattern formed of tungsten.

In some embodiments, a metal nitride layer pattern 160 serving as a diffusion barrier layer pattern may be interposed between the composite dielectric layer pattern 140 and the gate electrode 150 so as to reduce diffusion of metal or impurities. Examples of the metal nitride layer pattern 160 may include a tungsten nitride layer pattern, a titanium nitride layer pattern, a tantalum nitride layer pattern, and the like in accordance with some embodiments of the present invention.

A first diffusion region 104 and a second diffusion region 106 serving as source/drain regions may be formed at surface regions of the substrate 102 adjacent to the gate structure 110.

A surface portion of the substrate 102 beneath the gate structure 110 may serve as a channel region.

The non-volatile memory device 100, as described above, electrically conducts data programming or erasing through a F-N tunneling mechanism and/or a channel hot electron injection mechanism. For example, the charge trapping layer pattern 130 may store one bit of data (a logic state of '0' or '1'). In more detail, when a programming voltage of about 5 to about 18V is applied to the gate electrode 150, electrons are trapped in trap sites in the charge trapping layer pattern 130 from the substrate 102 by the F-N tunneling mechanism so that the logic state of '1' is stored in the charge trapping layer pattern 130. A threshold voltage of the channel region between the first and second diffusion regions 104 and 106 may be increased because of the trapped electrons. That is, the threshold voltage of the channel region may be varied according to the stored logic state in the charge trapping layer pattern 130, and the stored logic state may be ascertained by applying different reading voltages to the gate electrode 150 and the drain region (the first diffusion region 104 or the second diffusion region 106) and detecting a channel current.

In other embodiments, two bits of data may be stored in the charge trapping layer pattern 130 using the channel hot electron injection mechanism. Particularly, a first portion and a second portion of the charge trapping layer pattern 130 adjacent to the first and second diffusion regions 104 and 106 may store one bit of data each. For example, electrons may be trapped in the first portion of the charge trapping layer pattern 130 by applying programming voltages to the gate electrode 150 and the first diffusion region 104, and further electrons may be trapped in the second portion of the charge trapping layer pattern 130 by applying programming voltages to the gate electrode 150 and the second diffusion region 104. The stored data may be ascertained by applying reading voltages in a direction opposite to a programming direction. Examples of the programming and reading directions are disclosed, for example, in U.S. Pat. No. 6,649,972.

FIGS. 2 to 13 are cross-sectional views illustrating methods of manufacturing the gate electrode of the non-volatile memory device as shown in FIG. 1 in accordance with some embodiments of the present invention.

Figure 2:
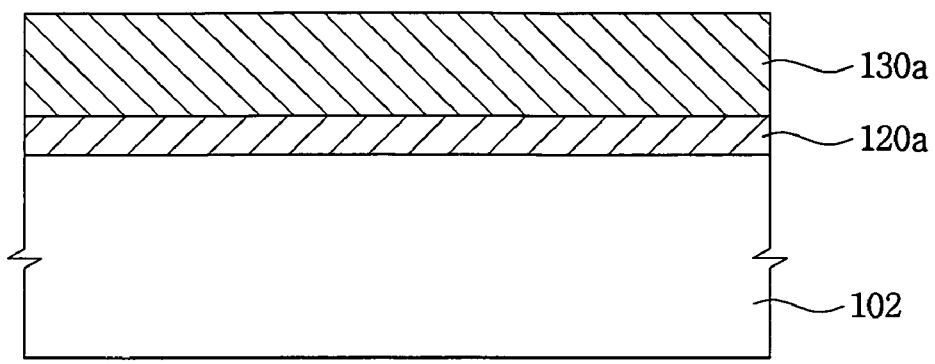
FIGS. 2 to 13 are cross-sectional views illustrating methods of manufacturing the gate electrode of the non-volatile memory device as shown in FIG. 1 in accordance with some embodiments of the present invention.

Referring to FIG. 2, the substrate 102 is divided into an active region and a field region using an isolation process such as a shallow trench isolation (STI) process. In other embodiments, the field region may be formed using a local oxidation of silicon (LOCOS) process.

A tunnel insulating layer 120a is formed to a thickness of about 10 to about 100 Å on the substrate 102. For example, the tunnel insulating layer 120a may include silicon oxide and be formed using a thermal oxidation process on the substrate 102.

A charge trapping layer 130a is formed on the tunnel insulating layer 120a and has a thickness of about 50 to about 150 Å. For example, the charge trapping layer 130a may include silicon nitride and be formed by a low-pressure chemical vapor deposition (LPCVD) process.

Figure 3:
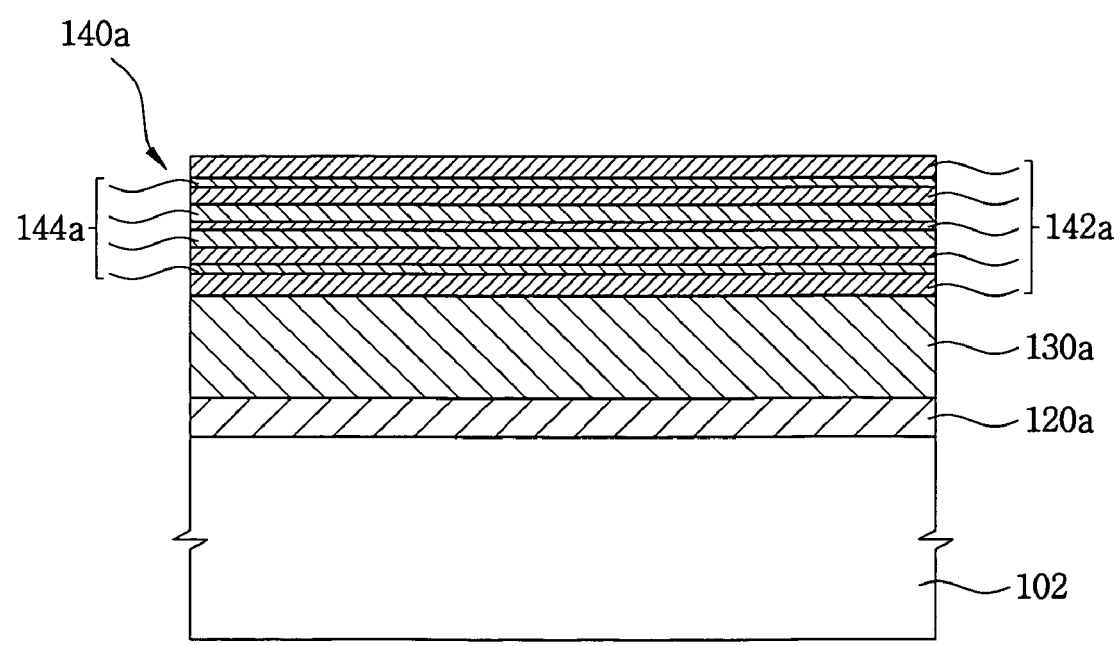

Referring to FIG. 3, a composite dielectric layer 140a is formed to a thickness of about 50 to about 500 Å on the charge trapping layer 130a and serves as a blocking layer. In some embodiments, the composite dielectric layer 140a may be formed to a thickness of about 70 to about 120 Å. The composite dielectric layer 140a may include high-k materials and be formed by first and second ALD processes. In more detail, the composite dielectric layer 140a may include a plurality of first material layers 142a and a plurality of second material layers 144a. The first material layers 142a may include aluminum oxide and the second material layers 144a may include hafnium oxide or zirconium oxide in accordance with some embodiments of the present invention. The first and second material layers 142a and 144a are alternately stacked and each of the first and second material layers 142a and 144a may have a thickness of about 1 to about 30 Å. A total thickness ratio of the first material layers 142a to the second material layers 144a may be from about 1:0.05 to about 1:20. Particularly, the total thickness ratio of the first material layers 142a to the second material layers 144a may be from about 1:0.5 to about 1:5.

Further, the first and second material layers 142a and 144a have thicknesses varied according to heights thereof. Particularly, the thicknesses of the first material layers 142a gradually decrease from the lowermost layer toward a center of the composite dielectric layer 140a and then gradually increase from the center toward the uppermost layer of the composite dielectric layer 140a. On the contrary, the thicknesses of the second material layers 144a gradually increase from the lowermost layer toward the center of the composite dielectric layer 140a and then gradually decrease from the center toward the uppermost layer of the composite dielectric layer 140a. However, the first and second material layers 142a and 144a may have a substantially uniform thickness in accordance with some embodiments of the present invention.

Hereinafter, methods of forming the composite dielectric layer 140a in accordance with some embodiments of the present invention will be described in detail with reference to FIGS. 4 to 11.

Figure 4:
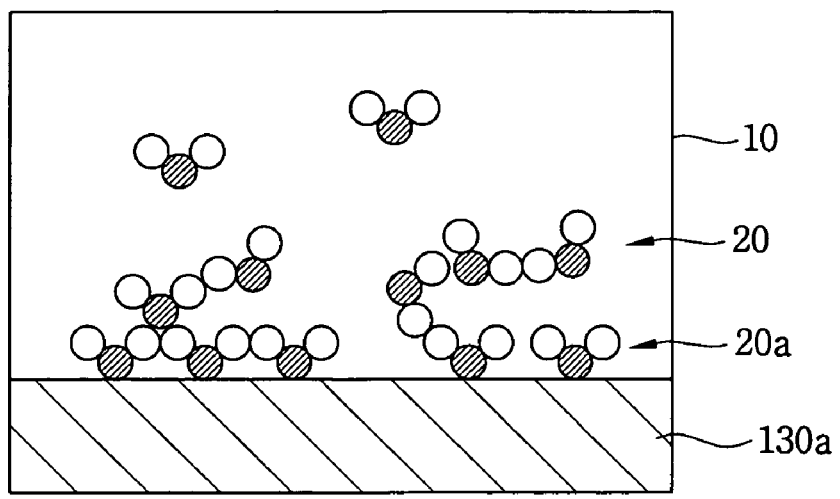

Referring to FIG. 4, the substrate 102 is positioned in a chamber 10 for an ALD process. When a temperature in the chamber 10 is lower than about 150° C., reactivity of reactants supplied for forming the composite dielectric layer 140a may deteriorate. When the temperature in the chamber 10 is higher than about 400° C., however, crystallization of the composite dielectric layer 140a may rapidly progress. Thus, an interior of the chamber 10 may be maintained at a temperature of about 150 to about 400° C. In some embodiments, the interior of the chamber 10 may be maintained at a temperature of about 250 to about 350° C. For example, the interior of the chamber 10 may be controlled at a temperature of about 300° C. so that the composite dielectric layer 140a having improved characteristics may be formed using an ALD process. Further, when a pressure in the chamber 10 is less than about 0.1 torr, reactivity of the reactants supplied into the chamber 10 may deteriorate. When the pressure in the chamber 10 is greater than about 3.0 torr, however, it is difficult to control process conditions. Thus, the pressure in the chamber 10 may be controlled to be about 0.1 to about 3.0 torr in accordance with some embodiments of the present invention.

A first reactant 20 including aluminum is supplied onto the substrate 102. For example, a gaseous aluminum precursor is supplied onto the substrate 102 by a carrier gas such as nitrogen, argon, or the like in accordance with some embodiments of the present invention. The gaseous aluminum precursor may be provided by a liquid delivery system (LDS) or a bubbler system. The aluminum precursor may include $Al(CH_3)_3$ (trimethyl aluminum; TMA), $Al(C_2H_5)_3$ (triethyl aluminum; TEA), and the like. These may be used alone or in a mixture thereof. For example, the first reactant 20 may be supplied onto the substrate 102 for about 0.5 to 3 seconds and, in some particular embodiments, for about 2 seconds.

First portions 20a of the first reactant 20 supplied onto the substrate 102 are chemisorbed on the charge trapping layer 130a. However, second portions except for the first portions of the first reactant 20 may be physically adsorbed on the chemisorbed first portions 20a or drift in the chamber 10.

Figure 5:
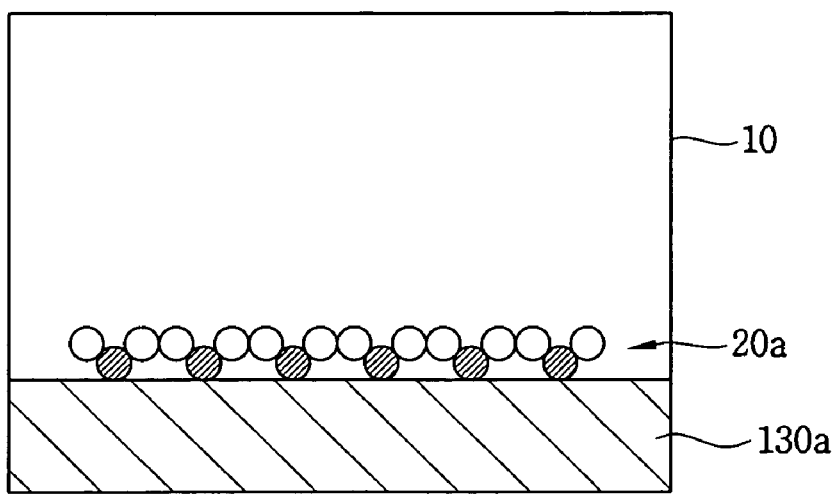

Referring to FIG. 5, a purge gas is introduced into the chamber 10. An inert gas, such as argon and nitrogen, may be used as the purge gas. The purge gas may be introduced into the chamber 10 for about 0.5 to about 5 seconds. For example, the purge gas may be introduced into the chamber for about 2 seconds.

The second portions physisorbed onto the chemisorbed first portions 20a of the first reactant 20 or drifting in the chamber 10 may be exhausted together with the introduced purge gas from the chamber 10.

Figure 6:
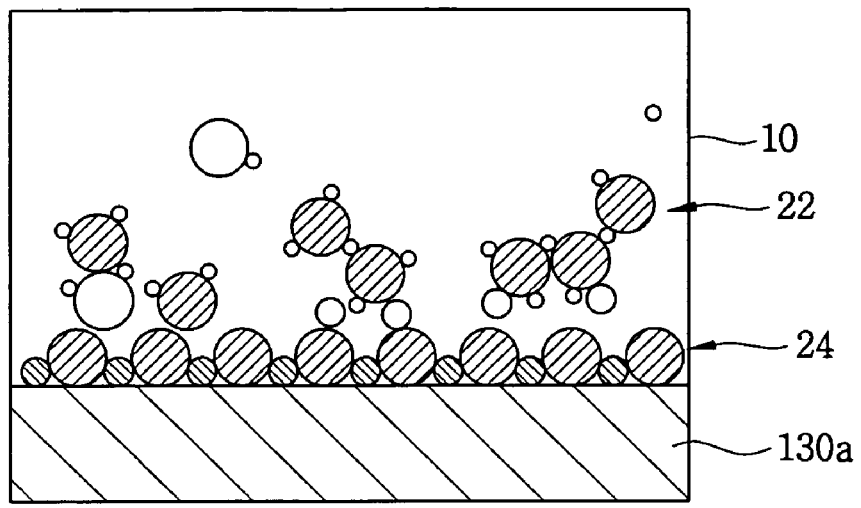

Referring to FIG. 6, a first oxidizing agent 22 is supplied onto the substrate 102. A first atomic layer 24 is formed on the charge trapping layer 103a by a reaction between the chemisorbed first portions 20a and the supplied first oxidizing agent 22. The first oxidizing agent may include $O_3$, $O_2$, $H_2O$, plasma $O_2$, and the like in accordance with some embodiments of the present invention. These may be used alone or in a mixture thereof.

For example, $O_3$ may be used as the first oxidizing agent and supplied onto the substrate 102 for about 1 to about 5 seconds. In particular embodiments, $O_3$ may be supplied onto the substrate 102 for about 3 seconds.

Figure 7:
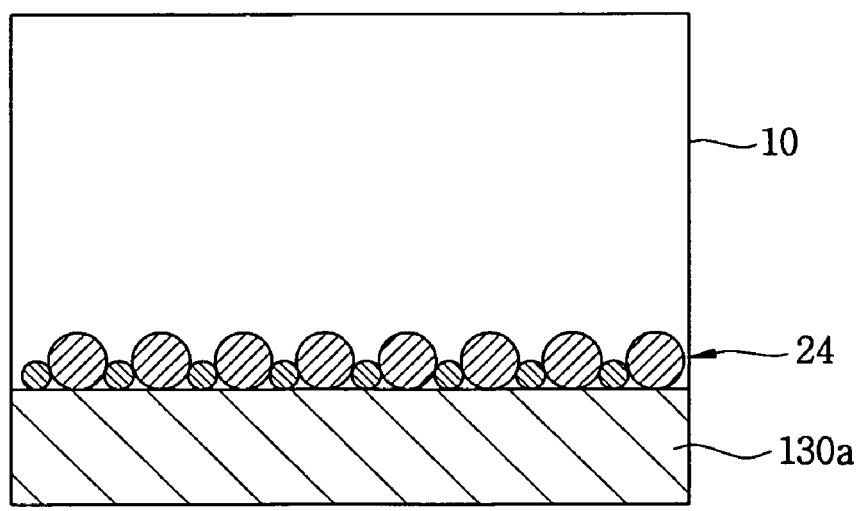

Referring to FIG. 7, a purge gas is introduced into the chamber 10 and reaction byproducts and remaining first oxidizing agent are exhausted together with the introduced purge gas from the chamber 10. The purge gas may be introduced into the chamber 10 for about 1 to about 5 seconds, e.g., for about 3 seconds.

The first ALD process, as described above, may be repeatedly performed until the first material layer 142a having a desired thickness is formed. Particularly, the number of times that the ALD process is repeated may be in a range of about one to about twenty times.

Figure 8:
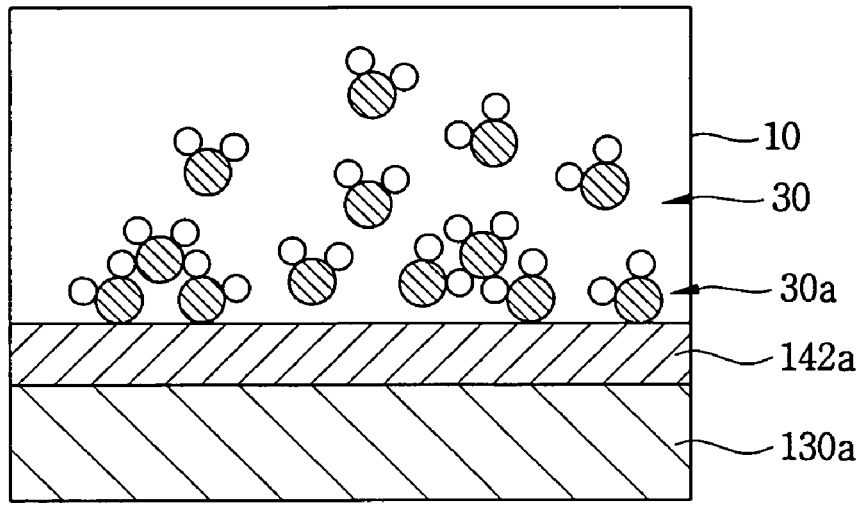

Referring to FIG. 8, a second reactant 30 including a hafnium precursor or zirconium precursor is supplied onto the first material layer 142a formed on the charge trapping layer 130a. The second reactant 30 may include a hafnium precursor, zirconium precursor, or the like in accordance with some embodiments of the present invention. Here, temperature and pressure in the chamber 10 are evenly maintained. Particularly, the interior of the chamber may be maintained at a temperature and pressure substantially equal to those used in forming the first material layer 142a in the chamber 10. First portions 30a of the second reactant 30 are chemisorbed onto the first material layer 142a, and second portions, except for the first portions 30a of the second reactant 30, are physically adsorbed on the chemisorbed first portions 30a or drift in the chamber 10.

The hafnium precursor may include $Hf[N(CH_3)_2]_4$ (tetrakis dimethyl amino hafnium; TDMAH), $Hf[N(C_2H_5)CH_3]_4$ (tetrakis ethyl methyl amino hafnium; TEMAH), $Hf[N(C_2H_5)_2]_4$ (tetrakis diethyl amino hafnium; TDEAH), $Hf[OC(CH_3)_2CH_2OCH_3]_4$, $Hf[OC(CH_3)_3]_4$, and the like in accordance with some embodiments of the present invention. The zirconium precursor may include $Zr[N(CH_3)C_2H_5]_4$ (tetrakis ethyl methyl amino zirconium; TEMAZ), $Zr(O-tBu)_4$ (zirconium t-butoxide), and the like in accordance with some embodiments of the present invention. These precursors may be used alone or in a mixture thereof. The second reactant 30 may be supplied onto the first material layer 142a for about 0.5 to about 3 seconds, e.g., for about 2 seconds.

Figure 9:
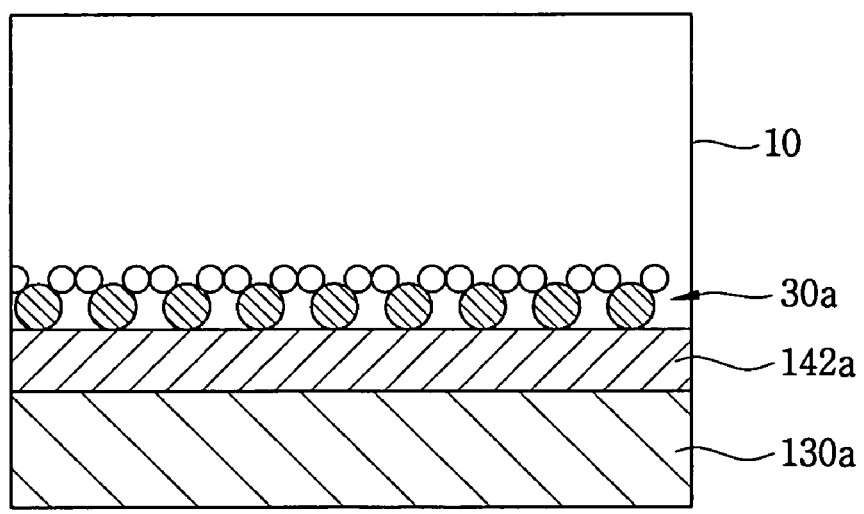

Referring to FIG. 9, a purge gas is introduced into the chamber 10. The purge gas may include an inert gas, such as argon and nitrogen. The purge gas may be introduced into the chamber 10 for about 0.5 to about 5 seconds, e.g., for about 2 seconds.

The second portions physisorbed onto the chemisorbed first portions 30a of the second reactant 30 or drifting in the chamber 10 may be exhausted together with the introduced purge gas from the chamber 10.

Figure 10:
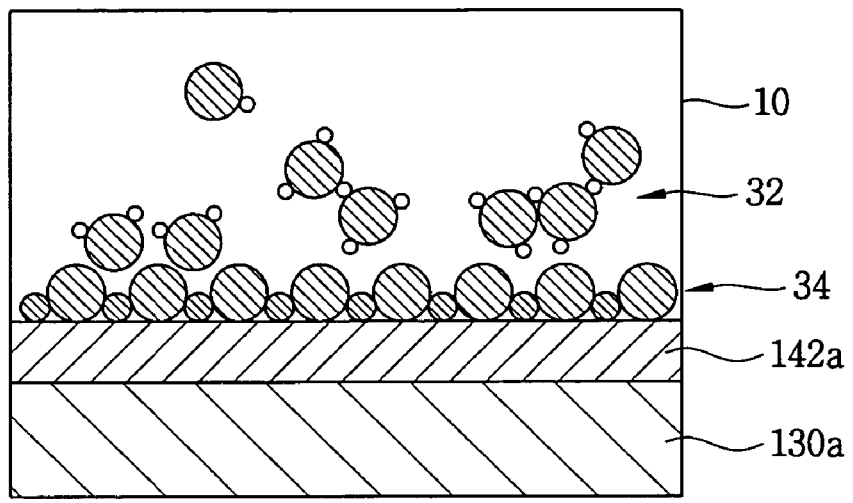

Referring to FIG. 10, a second oxidizing agent 32 is supplied onto the first material layer 142a. A second atomic layer 34 is formed on the first material layer 142a by reaction between the chemisorbed first portions 30a and the supplied second oxidizing agent 32. The second oxidizing agent may include $O_3$, $O_2$, $H_2O$, plasma $O_2$, and the like in accordance with some embodiments of the present invention. These may be used alone or in a mixture thereof.

For example, $O_3$ may be used as the second oxidizing agent and supplied onto the first material layer 142a for about 1 to about 5 seconds. Particularly, $O_3$ may be supplied onto the substrate 102 for about 3 seconds.

Figure 11:
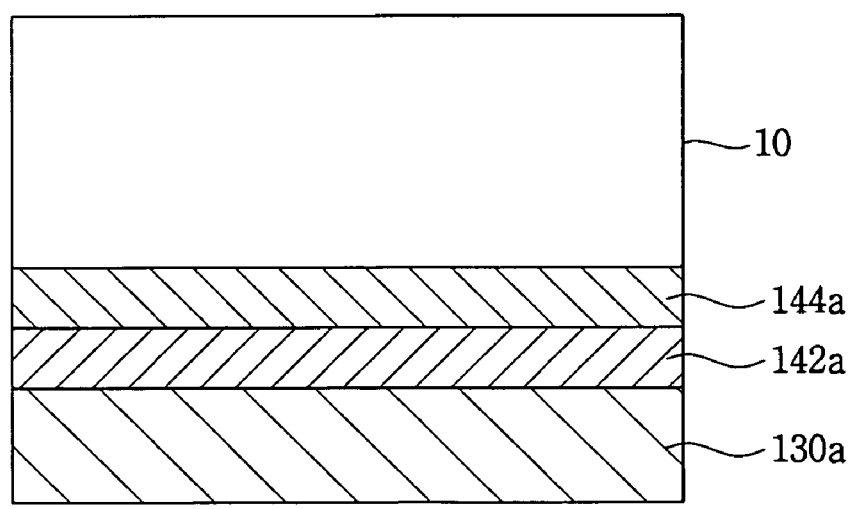

Referring to FIG. 11, a purge gas is introduced into the chamber 102 and reaction byproducts and remaining second oxidizing agent are exhausted together with the introduced purge gas from the chamber 10. The purge gas may be introduced into the chamber 10 for about 1 to about 5 seconds, e.g., for about 3 seconds.

The second ALD process, as described above, may be repeatedly performed until the second material layer 144a is formed to have a desired thickness. Particularly, the number of times that the ALD process is repeated may be in a range of about one to about twenty times.

The first ALD process for forming the first material layer 142a and the second ALD process for forming the second material layer 144a may be alternately performed so as to form the composite dielectric layer 140a. The uppermost and lowermost layers of the composite dielectric layer 140a may each be an aluminum oxide layer having a relatively high dielectric constant, and the first material layers 142a may have thicknesses that gradually increase from the center of the composite dielectric layer 140a toward the uppermost and lowermost layers. Thus, the leakage current restraining effect may be improved. Further, the second material layer 144a may have thicknesses that gradually increase from the uppermost and lowermost layers toward the center of the composite dielectric layer 140a. As a result, the capacitance of the composite dielectric layer 140a may be increased.

Moreover, each of the first and second material layers 142a and 144a may be formed to a thickness less than about 30 Å and, thus, a crystallization temperature of the composite dielectric layer 140a may become greater than about 900° C. As a result, crystallization of the composite dielectric layer 140a may be reduced or eliminated during a subsequent heat treatment. As a result, leakage current through the composite dielectric layer 140a may be reduced.

Heat treatment may be performed for densification of the composite dielectric layer 140a at a temperature of about 800 to about 1100° C., e.g., about 900° C., after forming the composition dielectric layer 140a.

Figure 12:
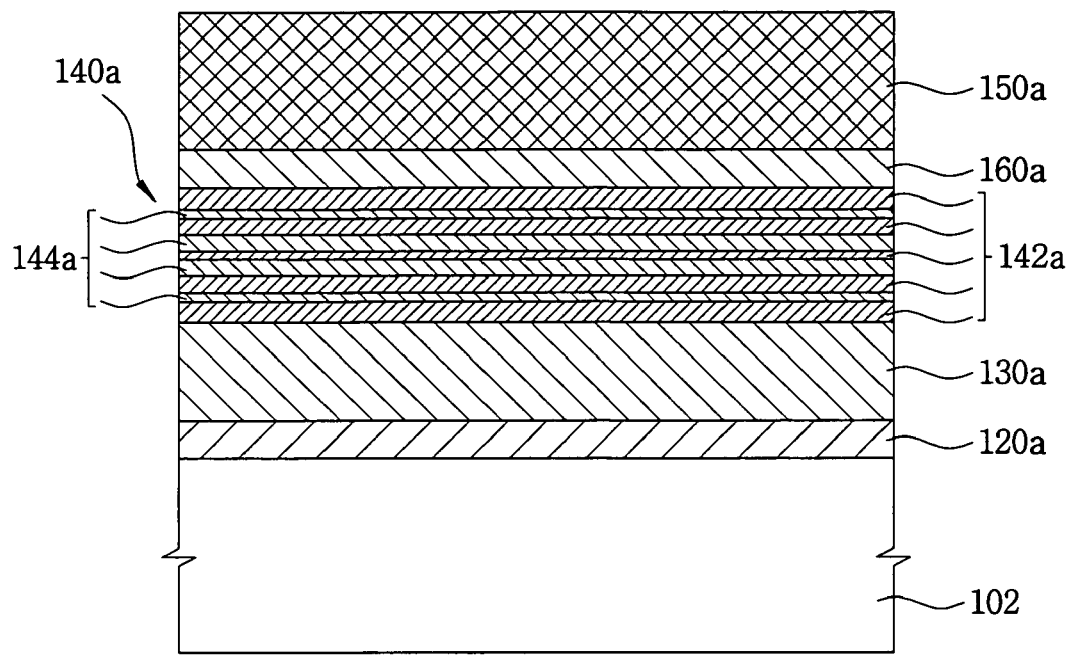

Referring to FIG. 12, a metal nitride layer 160a is formed on the composite dielectric layer 140a to reduce or prevent diffusion of metal or impurities. The metal nitride layer 160a may include tungsten nitride, titanium nitride, tantalum nitride, and the like, and be formed by a CVD process, a physical vapor deposition (PVD) process, a ALD process, etc. in accordance with some embodiments of the present invention.

A conductive layer 150a for the gate electrode 150 is formed on the metal nitride layer 160a. The conductive layer 150a may be an impurity doped polysilicon layer, a metal layer or a combination thereof, and formed to a thickness of about 1000 to about 3000 Å in accordance with some embodiments of the present invention.

The doped polysilicon layer may be formed using a LPCVD process and an impurity doping process. Various metal layers, e.g., a tungsten layer, may be used as the metal layer. Further, a metal silicide layer, such as a tungsten silicide layer, a titanium silicide layer, a tantalum silicide layer, or the like, may be formed on the doped polysilicon layer in accordance with some embodiments of the present invention.

Figure 13:
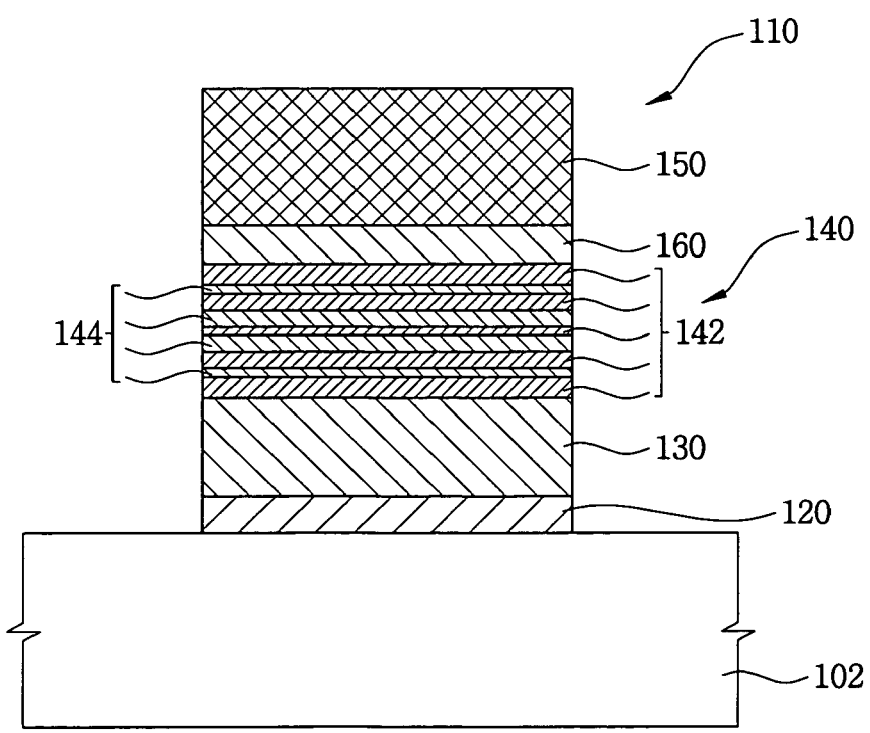

Referring to FIG. 13, a photoresist pattern is formed on the conductive layer 150a, and then an etching process using the photoresist pattern as an etching mask is performed to form the gate structure 110 including the tunnel insulating layer pattern 120, the charge trapping layer pattern 130, the composite dielectric layer pattern 140, the metal nitride layer pattern 160 and the gate electrode 150.

The photoresist pattern is removed by an ashing process and a stripping process after forming the gate structure 110. However, the gate structure 110 may be completed by an etching process using a hard mask including silicon nitride after the hard mask is formed on the conductive layer 150a in some embodiments of the present invention.

The first and second diffusion regions 104 and 106 are formed at the surface portions of the substrate 102 adjacent to the gate structure 110 so as to form the non-volatile memory device 100 as shown in FIG. 1. Though not shown in the figures, spacers may be formed on sidewalls of the gate structure 110 in accordance with some embodiments of the present invention.

Leakage Current Characteristics through the Composite Dielectric Layer

Figure 14:
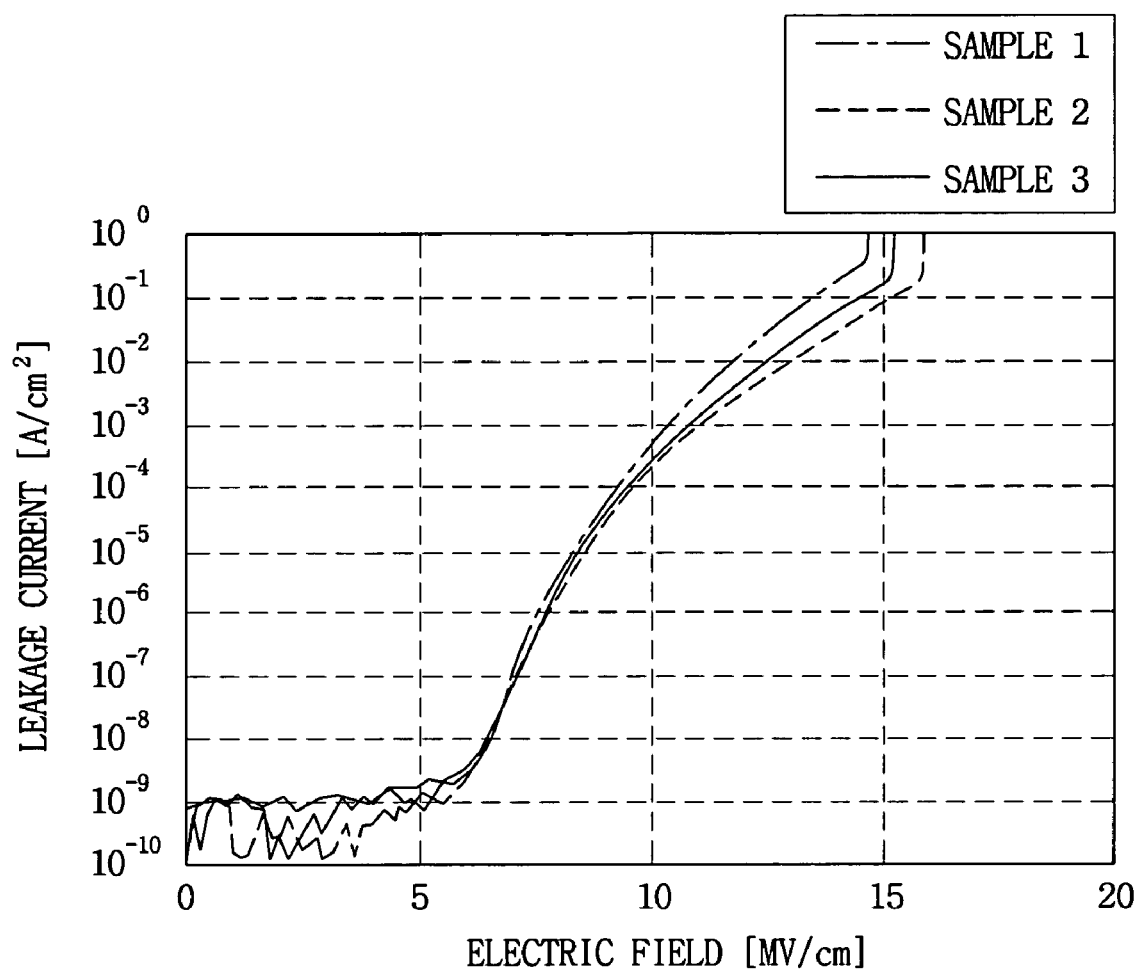
FIG. 14 is a graph representing leakage currents through aluminum oxide layers formed by a conventional method.
Figure 15:
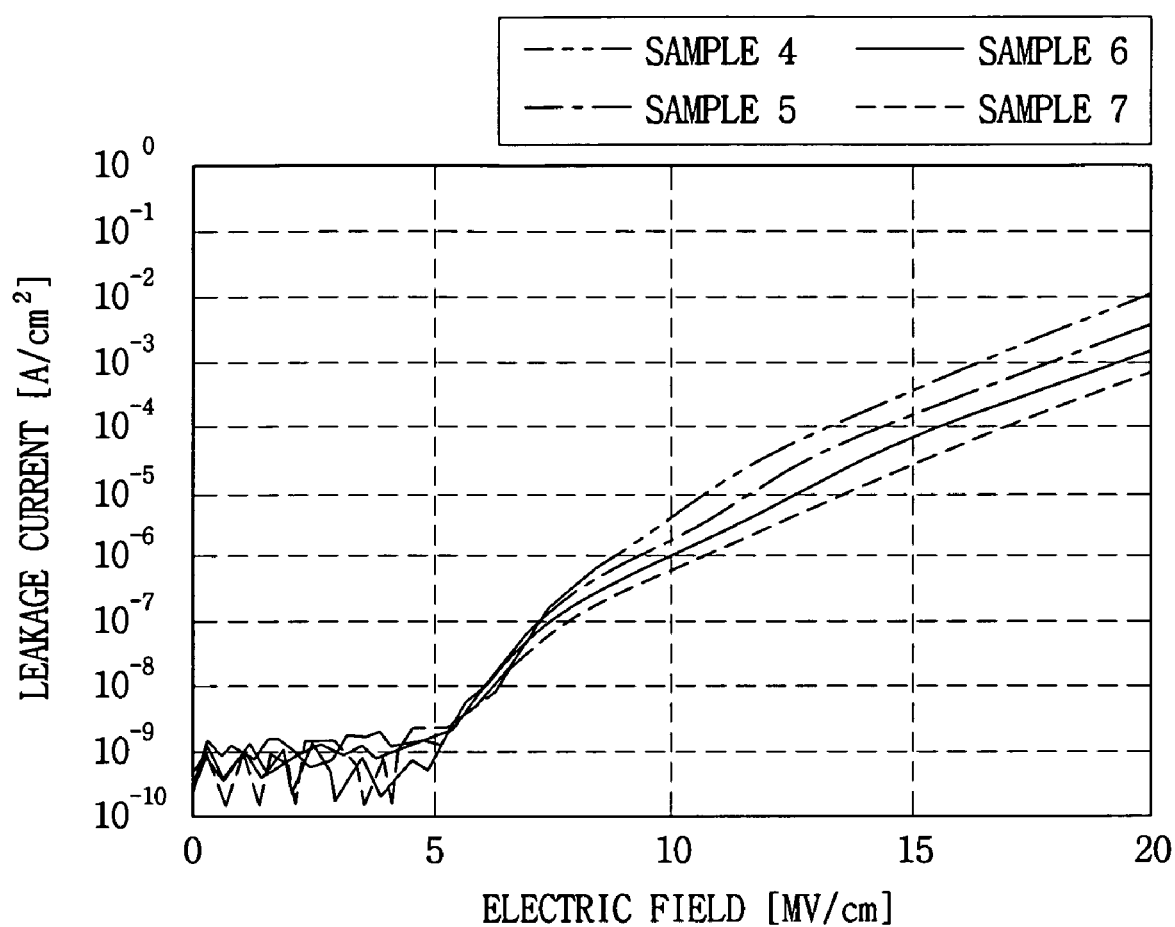
FIG. 15 is a graph representing leakage currents through composite dielectric layers formed in accordance with some embodiments of the present invention.

FIG. 14 is a graph representing leakage currents through aluminum oxide layers formed by a conventional method, and FIG. 15 is graph representing leakage currents through composite dielectric layers formed in accordance with some embodiments of the present invention.

Primarily, non-volatile memory devices using an aluminum oxide layer as a blocking layer were formed using the conventional method. Particularly, a tunnel insulating layer and a charge trapping layer were successively formed on a semiconductor substrate, and then a first aluminum oxide layer was formed to a thickness of about 150 Å on the charge trapping layer by an ALD process using an aluminum precursor and an oxidizing agent. A conductive layer for a gate electrode was formed on the first aluminum oxide layer, and a first sample was then prepared by patterning the conductive layer, the first aluminum oxide layer, the charge trapping layer and the tunnel insulating layer. An equivalent oxide thickness (EOT) of the first aluminum oxide layer was about 81 Å.

A second sample including a second aluminum oxide layer having a thickness of about 200 Å was prepared by a method substantially identical to the method of manufacturing the first sample. Here, an EOT of the second aluminum oxide layer was about 104.3 Å.

A third sample including a third aluminum oxide layer having a thickness of about 250 Å was prepared by a method substantially identical to the method of manufacturing the first sample. Here, an EOT of the third aluminum oxide layer was about 124.6 Å.

Thereafter, fourth, fifth, sixth and seventh samples were prepared in accordance with exemplary embodiments of the present invention. Particularly, a tunnel insulating layer and a charge trapping layer were successively formed on a semiconductor substrate. A first hafnium aluminum oxide layer having a laminate structure, in which first material layers including aluminum oxide and second material layers including hafnium oxide are alternately stacked, and serving as a blocking layer was formed on the charge trapping layer. A conductive layer for a gate electrode was formed on the first hafnium aluminum oxide layer, and then the fourth sample was prepared by patterning the conductive layer, the first hafnium aluminum oxide layer, the charge trapping layer, and the tunnel insulating layer. A total thickness and an EOT of the first hafnium aluminum oxide layer were about 116 Å and about 61.4 Å, respectively. Here, a ratio of a hafnium content to an aluminum content in the first hafnium aluminum oxide layer was about 1:1.

The fifth sample including a second hafnium aluminum oxide layer having a thickness of about 179 Å was prepared by a method substantially identical to the method of manufacturing the fourth sample. Here, an EOT of the second hafnium aluminum oxide layer was about 78.5 Å.

The sixth sample including a third hafnium aluminum oxide layer having a thickness of about 233 Å was prepared by a method substantially identical to the method of manufacturing the fourth sample. Here, an EOT of the third hafnium aluminum oxide layer was about 96 Å.

The seventh sample including a fourth hafnium aluminum oxide layer having a thickness of about 303 Å was prepared by a method substantially identical to the method of manufacturing the fourth sample. Here, an EOT of the fourth hafnium aluminum oxide layer was about 112.7 Å.

Variations of electric field applied to the gate structures and leakage current measured through the blocking layers in accordance with variation of the gate voltage applied to the samples are represented in FIGS. 14 and 15.

Referring to FIGS. 14 and 15, the leakage currents of the first, second and third samples formed by the conventional methods increased significantly when the electric field exceeds about 5 MV/cm. In contrast, the leakage currents of the fourth, fifth, sixth and seventh samples formed in accordance with exemplary embodiments of the present invention were largely reduced as compared with the first, second and third samples.

As a result, it can be seen that the leakage current in a non-volatile memory device can be reduced through use of a composite dielectric layer in accordance with some embodiments of the present invention.

According to the example embodiments of the present invention described above, a composite dielectric layer in which the first material layers include aluminum oxide and the second material layers include hafnium oxide or the zirconium oxide are alternately stacked, may be used as a blocking layer in a gate structure of a non-volatile memory device. As a result, the leakage current through the composite dielectric layer may be reduced and the cell capacitance may be increased. Thus, operating characteristics of the non-volatile memory device may be improved.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A gate structure of a non-volatile memory device comprising:
   a tunnel insulating layer pattern formed on a substrate;
   a charge trapping layer pattern formed on the tunnel insulating layer pattern;
   a composite dielectric layer pattern formed on the charge trapping layer pattern, the composite dielectric layer pattern having a laminate structure comprising a plurality of first material layer patterns comprising aluminum oxide and a plurality of second material layer patterns comprising a high-k material having a dielectric constant higher than that of aluminum oxide, which are alternately stacked;

a gate electrode formed on the composite dielectric layer pattern; and a metal nitride layer pattern interposed between the composite dielectric layer pattern and the gate electrode;

wherein the second material layer patterns have thicknesses that increase from an uppermost layer and a lowermost layer of the composite dielectric layer pattern toward a center of the composite dielectric layer pattern.

2. The gate structure of claim 1, wherein each of the second material layer patterns is a hafnium oxide layer pattern or a zirconium oxide layer pattern.

3. The gate structure of claim 2, wherein an aluminum content of the composite dielectric layer pattern decreases from the charge trapping layer pattern and the gate electrode toward a center of the composite dielectric layer pattern, and a hafnium content or a zirconium content of the composite dielectric layer pattern increases from the charge trapping layer pattern and the gate electrode toward the center of the composite dielectric layer pattern.

4. The gate structure of claim 1, wherein each of an uppermost layer and a lowermost layer of the composite dielectric layer pattern is an aluminum oxide layer pattern.

5. The gate structure of claim 1, wherein the first material layer patterns have thicknesses that decrease from an uppermost layer and a lowermost layer of the composite dielectric layer pattern toward a center of the composite dielectric layer pattern.

6. The gate structure of claim 1, wherein the composite dielectric layer pattern has a thickness of about 50 to about 500 Å.

7. The gate structure of claim 1, wherein each of the first material layer patterns and the second material layer patterns has a thickness of about 1 to about 30 Å.

8. The gate structure of claim 1, wherein a total thickness ratio of the first material layer patterns to the second material layer patterns is from about 1:0.5 to about 1:5.

9. The gate structure of claim 1, wherein the charge trapping layer pattern is a silicon nitride layer pattern.

10. The gate structure of claim 1, wherein the gate electrode is an impurity doped polysilicon layer pattern, a metal layer pattern or a combination thereof.

* * * * *